United States Patent
Miyamoto et al.

(10) Patent No.: US 7,308,500 B1
(45) Date of Patent: Dec. 11, 2007

(54) MODEL FOR COST OPTIMIZATION AND QOS TUNING IN HOSTED COMPUTING ENVIRONMENTS

(75) Inventors: Carleton Miyamoto, Santa Clara, CA (US); Jagadish Bandhole, San Jose, CA (US)

(73) Assignee: Symantec Operating Corporation, Cupertino, CA (US)

( * ) Notice: Subject to any disclaimer, the term of this patent is extended or adjusted under 35 U.S.C. 154(b) by 0 days.

(21) Appl. No.: 11/527,436

(22) Filed: Sep. 26, 2006

Related U.S. Application Data

(63) Continuation of application No. 11/080,133, filed on Mar. 15, 2005, now Pat. No. 7,113,991, which is a continuation of application No. 10/093,826, filed on Mar. 7, 2002, now Pat. No. 6,868,449.

(60) Provisional application No. 60/276,850, filed on Mar. 16, 2001.

(51) Int. Cl.
 *G06F 15/173* (2006.01)

(52) U.S. Cl. .................... 709/226; 718/104; 713/1

(58) Field of Classification Search ............... 709/225, 709/226, 204, 217; 370/255; 713/1.2; 718/104
See application file for complete search history.

(56) References Cited

U.S. PATENT DOCUMENTS

| | | | |
|---|---|---|---|
| 3,868,158 A | 2/1975 | Laboue .................. | 211/175 |
| 5,031,075 A | 7/1991 | Casanova et al. ......... | 361/683 |
| 6,185,098 B1 | 2/2001 | Benavides ............. | 361/724 |
| 6,496,366 B1 | 12/2002 | Coglitore et al. ......... | 361/724 |
| 6,643,141 B2 | 11/2003 | Kaetsu et al. ........... | 361/797 |
| 2002/0049803 A1 | 4/2002 | Bandhole et al. ........ | 709/104 |
| 2002/0057684 A1 | 5/2002 | Miyamoto et al. ........ | 370/386 |
| 2002/0059377 A1 | 5/2002 | Bandhole et al. ........ | 709/204 |
| 2002/0120741 A1 | 8/2002 | Webb et al. ............. | 709/225 |

*Primary Examiner*—Lisa Lea-Edmonds
(74) *Attorney, Agent, or Firm*—Campbell Stephenson LLP

(57) ABSTRACT

Two computers of a standard size, such as 1U, are mounted in a single standard size space. This arrangement almost doubles the space utilization of a rack and thereby halves the cost of hosting a dynamic computing environment. Also, a plurality of chassis are mounted on a rack where each chassis can hold more than one single-board computers. This arrangement enables provisioning of computing environments computing power in increments other than multiples of 1U.

18 Claims, 4 Drawing Sheets

MODEL FOR COST OPTIMIZATION AND QOS TUNING IN HOSTED COMPUTING ENVIRONMENTS

CROSS-REFERENCE TO RELATED APPLICATIONS

This application is a continuation of Ser. No. 11/080,133 filed Mar. 15, 2005, now U.S. Pat. No. 7,113,991, entitled "Model for Cost Optimization and QoS Tuning In Hosted Computing Environments," issued on Sep. 26, 2006, naming Carleton Miyamoto and Jagadish Bandhole as inventors, which is a continuation of Ser. No. 10/093,826 filed Mar. 7, 2002, now U.S. Pat. No. 6,868,449, entitled "Model for Cost Optimization and QoS Tuning In Hosted Computing Environments," issued on Mar. 15, 2005, which claims the benefit of priority under 35 U.S.C. § 119 from U.S. Provisional Patent Application No. 60/276,850, filed on Mar. 16, 2001. These applications are incorporated by reference herein, in their entirety and for all purposes.

This application is related to U.S. Pat. No. 7,082,521, entitled "User Interface for Dynamic Computing Environment Using Allocateable Resources," issued on Jul. 25, 2006, U.S. Pat. No. 7,065,637, entitled "System for Configuration of Dynamic Computing Environments Using a Visual Interface," issued on Jun. 20, 2006, U.S. patent application Ser. No. 09/861,483, entitled "Dynamic Computing Environment Using Remotely Allocable Resources," filed on May 17, 2001, and U.S. Pat. No. 7,027,412, entitled "System for Dynamic Provisioning of Secure, Scalable, and Extensible Networked Computing Environments," issued on Apr. 11, 2006, which are hereby incorporated by reference, as if set forth in full in this document, for all purposes.

BACKGROUND OF THE INVENTION

The present invention relates in general to digital processing and more specifically to networked computing environments and a model for amortization of hosting cost and for fine-tuning Quality of Service (QoS) in networked computing environments that are hosted in centralized locations.

Today's computing environments are almost always networked and in particular are connected to the Internet. Logistical reasons such as space management, physical security, power distribution, and communication access require computing environments of any reasonable size to be located in Network Operation Centers (NOCs).

Also known as Data Centers or Hosting Centers, NOCs act as the physical hubs of the Internet, where computing systems are located in a large scale and have access to communication bandwidth. An NOC may directly serve a single organization such as a large corporation, or serve multiple organizations, both large and small, through an intermediary organization responsible for the maintenance and administration of the NOC. In either case, an NOC is physically divided into multiple isolated units of physical space called 'cages', where each cage is self-contained in terms of access to power lines and communication lines. A cage can hold a multitude of 'racks', each of which is a shelf, usually satisfying an industry-standard specification for size.

A rack is a rectangular frame with four vertical angles (one at each corner) and one or more matching pairs of supporting braces on opposite sides. Each rack typically has 42 units of space and each unit is usually referred to as '1U'. Thus, at most, 42 computers of size 1U can be stacked up in a single rack. Other possible arrangements of computers on a rack may be, for instance, a rack that can hold at most 21 computers of size 2U, a rack that can hold at most 10 computers of size 4U, and so on. These computers are specially packaged to fit on a rack and are referred to as 'rack-mountable' boxes. The height (or thickness) of a box bas been standardized in the industry to be a multiple of 1U.

A major component of the cost associated with hosting in a data center is the cost of the space used. One limitation of the prior art physical arrangement of computers on racks is that only boxes of certain sizes can be hosted, i.e., the quality of the computing service is tightly coupled to the physical sizes of rack-mountable boxes. Thus, NOCs are restricted in the quality of computing offered in the racks.

FIG. 1 illustrates a prior art arrangement of computers on a rack 12 within an NOC 10. Typically, forty computers 14 of 1 U size are mounted on a rack so that each computer occupies 1U of the height of the rack and the top most two 1U units are used for power extension modules. Power cables 22 are connected to the back of computers 14 and extend to a power extension module 30 on the top of rack 12. In prior art systems, access to both the front and the rear of computers 14 is required. One side (typically the rear side) includes the power controls for administration (power-on, power-off, and reboot) and the other side (typically the front side) includes the floppy drives or CD drives for software installations/upgrades (in particular, installation of OS or booting). Both sides need to be accessed in prior art systems because activities associated with computers 14, such as administration and installations, are done manually making the accessibility of both sides of computers 14 necessary.

Typically, NOCs receive customer requests for a network with a certain amount of computing power. The NOC then manually sets up the network with computers 14. A multiple of 1U of computing power is allocated to a customer. Smaller increments of computing power are not available because the entire 1U computer is allocated. Thus, the allocation of computing power is not tunable in increments of computing power under 1U.

SUMMARY OF THE INVENTION

In one embodiment of the present invention, a model for optimization of hosting cost and for fine tuning quality of service through effective space utilization and/or dynamic provisioning in hosted computing environments is provided. Effective utilization of space is achieved by alternate arrangements of computers of various sizes and computing power on racks in a hosting center. The different rack mounting arrangements enable provisioning of computing environments from a wide array of choices with respect to cost. Thus, the quality of a hosted dynamic computing service may be fine-tuned to meet customers' needs.

In one embodiment, two computers of a standard size, such as 1U, are mounted in a single standard size space. This arrangement almost doubles the space utilization of a rack and thereby halves the cost of hosting a dynamic computing environment.

In another embodiment, a plurality of chassis are mounted on a rack where each chassis can hold more than one single-board computers. This arrangement enables provisioning of computing power in increments other than multiples of 1U.

The above environments may be automatically provisioned using the provisioning infrastructure of a dynamic computing environment. The automatic allows the provisioning computers without manual access enabling the placement of computers in a back-to-back manner in the rack in one embodiment. Additionally, the single-board computers may be provisioned without manual access.

In one embodiment, a computer rack system is provided. The computer rack system comprises: one or more computer racks, each comprising, a longitudinal cross section bounded by first and second surfaces perpendicular to the longitudinal cross section; a latitudinal cross section bounded by top and bottom surfaces perpendicular to said latitudinal cross section which is defined as being at least a standard size of rack space; a first computer having a front surface, said first computer being mountable on the rack such that said first surface is within said first surface of the rack; and a second computer having a second front surface, said second computer being mountable on the rack such that said second front surface is within said second surface of the rack, such that the first and second computers of the standard size are mountable within a single standard size of rack space.

In another embodiment, a method for provisioning a dynamic computing environment is provided. The method comprises: providing a computer rack system having one or more racks, each rack including at least a standard size of rack space, wherein first and second computers are mounted within the standard size of rack space; receiving a request to create the dynamic computing environment; and provisioning at least one of the first or second computers in the rack to create the dynamic computing environment.

A further understanding of the nature and advantages of the invention herein may be realized by reference of the remaining portions in the specifications and the attached drawings.

DESCRIPTION OF THE SPECIFIC EMBODIMENTS

Figure 1:
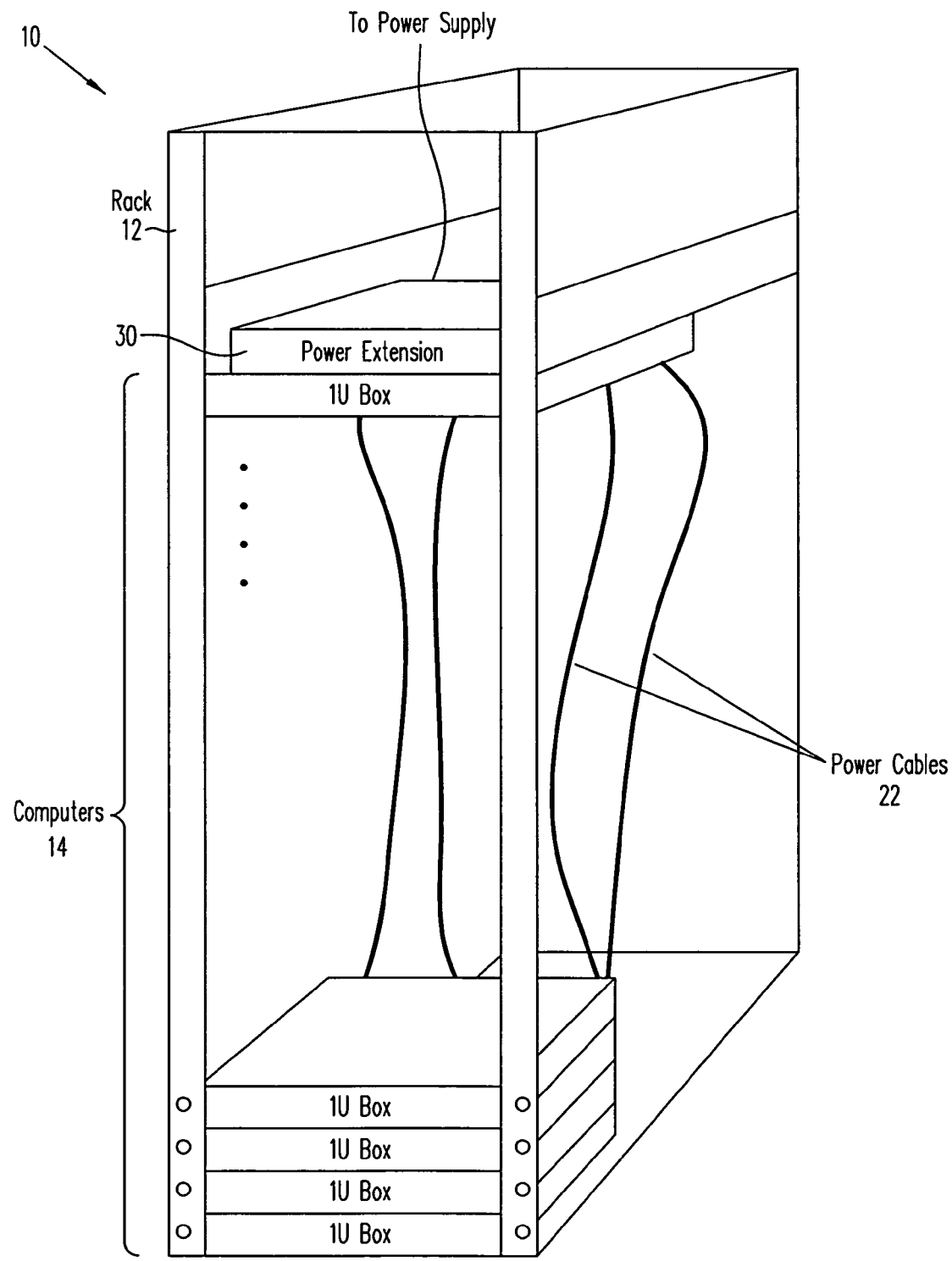
FIG. 1 illustrates prior art arrangement of computers on a rack.

One embodiment of the present invention allows fast, efficient selection and configuration of processing networks, which can then be accessed and managed remotely. The processing network is referred to as a system including "resources." A system resource is any hardware, software, or communication components in the system. For example, discrete hardware devices include processing platforms such as computers or processors, mobile/laptop computers, embedded computing devices, hand-held computers, personal digital assistants, point-of-sale terminals, smart-card devices, storage devices, data transmission and routing hardware etc., without limitation. Additionally, computer peripherals such as monitors, input/output devices, disk drives, manufacturing devices, or any device capable of responding to, handling, transferring or interacting with digital data are also resources. Software, or any other form of instruction, is executed by processors in the system and is also a type of resource. Finally, communication resources are also part of the system such as a digital network's hardware including the network's configuration and topology, where control of the network is provided by software and/or hardware. Additionally, the network may be based on wired connections or wireless connections. For instance, the network hardware and software may be based on Bluetooth wireless standards.

For example, a processing network of a general consumer might include a PDA and a cell phone, each connected by wireless channels to a single personal computer, which in turn is connected to an email server at a remote location through the Internet. As another example, a processing network might include a personal computer running Microsoft Windows 98 operating system, a lap-top computer running Linux operating system, and another personal computer running Windows NT operating system along with router and firewall software, wherein all three computers are connected using a local Ethernet hub, and the router software routes connections to the Internet.

According to an embodiment of the present invention, the resources for such a processing network are fully selectable and allocable by a system architect. In a specific embodiment, a primary company, Jareva Technologies, Inc.® provides proprietary technology to a system architect for designing a system by allocating resources and specifying how the resources are to be used. The system architect can be an individual, corporate entity, etc. The system is referred to as an "environment"—or more specifically as a "computing environment" and the primary provider of such an environment is referred to as an Environment Service Provider (ESP). A typical system architect is referred to as the "customer." The primary provider obtains revenue for providing the resources and the tools to easily select, allocate, configure and run the environment.

The specific embodiment of the present invention allows fast allocation and configuration of resources such that different environments can be created from the same resources within minutes, or even seconds. This allows "time sharing" of overall resources so that a first environment can be "alive" or operative for a time period defined by the system architect (e.g., daily two-hour slot), followed by second, third and fourth environments being instantly created for the next four hours for three different customers, and so on. After a time period expires, such environments might either manually or automatically de-allocate such resources. Since these "computing environments" can be dynamically configured and re-configured out of the same set of resources, these will also be referred to as "Dynamic Computing Environments".

In particular, environments without any computing devices i.e., environments made only of networks, will also be referred to as "virtual networked environments" or simply as "virtual networks".

A specific embodiment allows customers to create a computing environment from a remotely-accessible user interface such as a web page on the Internet. Thus, the customer can create, modify and operate the environment from anywhere in the world. Since the resources, in turn, can communicate over networks, including the Internet, this approach eliminates the cost of shipping hardware and software. Hardware and software designers, programmers, testers or other personnel using an environment according to the present invention can, similarly, be located anywhere in the world such that labor costs are optimized.

The creation of dynamic computing environments ("DCE") is automatic. For example, a customer can request a web-site simulator using twelve web-page servers on a Microsoft® NT platform, two disk arrays at a specific bandwidth and storage capacity, two caching servers and 200 clients running Netscape Navigator™ under Microsoft Windows® 2000 using Pentium III™ processors at under 800 MHz. Such an environment is created and destroyed, and even re-created automatically, without human intervention each time. Unlike the conventional computing infrastructure, according to an embodiment of the present invention there is no need to physically couple or de-couple, each physical machine or resource to each other upon adding or removing such resources. There is no need to set-up Internet Protocol (IP) addresses or other network settings, or install operating systems and associated application programs on one or more physical machines. All such activities on a DCE can be performed automatically without user intervention.

According to an embodiment of the present invention, the DCE is a virtual computing system including a network comprising a number of distinct types of machines and a network connecting them. For example, a system architect might require a DCE to include a Sun Sparc running a certain version of Solaris O/S coupled to a Linux machine. The present invention enables the separation of the activity of designing a DCE, from the activity of actually creating the DCE. Designing a DCE includes choosing the specific hardware, choosing the operating systems or other software, and choosing the specific interconnections, etc. Creating a DCE includes allocating the resources, installing the operating systems and other software, etc. Furthermore, the present invention automates the process of creating the DCE. A DCE for which resources have not been allocated yet will also be referred to as a virtual computing environment. Similarly, a computing device (or a subnet) that is part of a DCE will also be referred to as a virtual computing device (or a virtual subnet), if the required resources for the computing device (or the subnet) have not been allocated yet.

An embodiment of the present invention provides a framework that enables configuring, and provisioning DCEs remotely. Configuring a DCE involves choosing the resources and their interconnections. The present invention supports operations for making such design choices through appropriate programmable interfaces. The interfaces can be used interactively through a graphical user interface such as a web page or non-interactively through a program script. Provisioning a DCE involves allocation of physical resources required for a DCE to function. The present invention manages the physical resources needed for provisioning DCEs and supports operations for allocating/de-allocating these resources. In one embodiment of the present invention, the framework for provisioning DCEs is implemented as a distributed system consisting of different software programs running on different computers and networking hardware. In a further embodiment, the present invention permits "virtual" hosting of dynamic computing environments. As used herein, the term "virtual" specifies that neither the requisite devices nor the network need to be physically accessible to users. Further, in accordance with this embodiment, the hosting process may be initiated or terminated by users at will, from any geographic location. Thus the administrative framework allows users to remotely configure and provision DCEs.

A further understanding of embodiments of the present invention will be gained with reference to the diagrams and the descriptions that follow.

Figure 2:
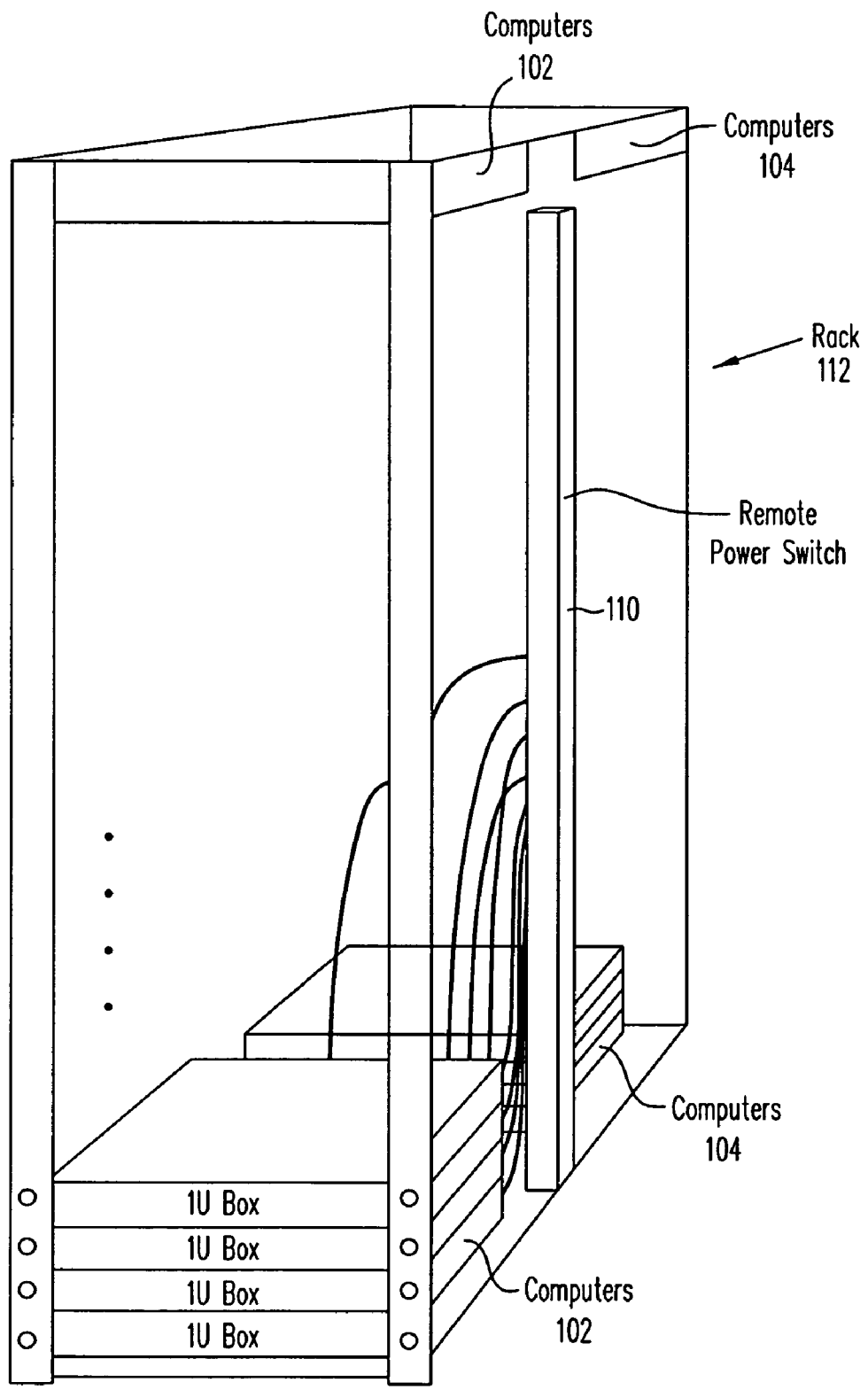
FIG. 2 illustrates an embodiment of mounting computers on a rack.

FIG. 2 illustrates an embodiment of a rack 112 with computers 102 mounted on one side of rack 112 and computers 104 mounted on another side of rack 112. Rack 112 is a standard size and each pair of computers 102 and 104 are mounted back-to-back in a standard size of rack space.

In one embodiment, rack 112 is a standard rack of size 42U and includes forty-two standard sizes of rack space of 1U each. Each computer 102 and 104 is of a standard size, such as 1U. Thus, forty-two pairs or eighty-four computers of 1U size may be mounted on rack 112 and the space requirements for hosting are halved. It will also be understood that any rack size and any standard size of rack space may be used and a person skilled in the art will appreciate other rack sizes and standard sizes of rack space. For example, a standard size of rack space may be 2U or 4U. However, for discussion purposes, 1U of rack space is assumed.

In another embodiment, power extension modules on the top of a rack are replaced by remote power switches 110, which are mounted vertically on the sides of rack 112. Thus, 42 pairs or 84 computers of 1U size may be mounted on single rack 112 with the additional ability of remote power control.

Maintenance or replacement of computers on rack 112 may be difficult because computers 102 and 104 are mounted back-to-back. To alleviate possible problems, 1U of space may be left void between stacks of a number of computer pairs in one embodiment. For instance, in one embodiment, a single 1U space is left void for every six pairs of computers of 1U size arranged back-to-back. If one computer needs to be removed or replaced, then at most five other computers will be affected by the removal or replacement. With one space left open for every six computers, thirty-eight pairs or seventy-six computers of 1U size may be mounted on rack 112 reducing the space requirements for hosting by approximately forty-two percent in this embodiment.

In one embodiment, Dynamic Computing Environments (DCEs) are used for provisioning computing resources on demand, and are hosted on rack 112. By reducing hosting space, hosting cost associated with space allocation is optimized. For instance, if in a particular service scenario where brief down-times will not cause substantial havoc, rack 112 with 42 pairs of back-to-back 1U size computers 102 and 104 may be chosen to minimize space usage. Also, if computer removals or replacements are common and down-times are critical, then a spaced arrangement will localize down-times to a few computers, at the cost of reduced efficiency in space utilization.

DCEs enable remote administration of computers. For example, remote administration is disclosed in U.S. Pat. No. 7,065,637 entitled "System for Configuration of Dynamic Computing Environments Using a Visual Interface," issued on Jun. 6, 2006, and U.S. Non-Provisional patent application Ser. No. 09/861,483 filed on May 17, 2001 entitled "Dynamic Computing Environment Using Remotely Allocable Resources", which are hereby incorporated by reference, as if set forth in full in this document, for all purposes. Remote administration features, such as remote provisioning, remote access, remote booting, and remote reinstallation of Operating Systems, allow a computer in rack 112 to be configured without manual access. Thus, computers may be positioned back-to-back because manual access to back-to-back computers, specifically the front or back, is typically not needed for provisioning and administering the computers.

Figure 3:
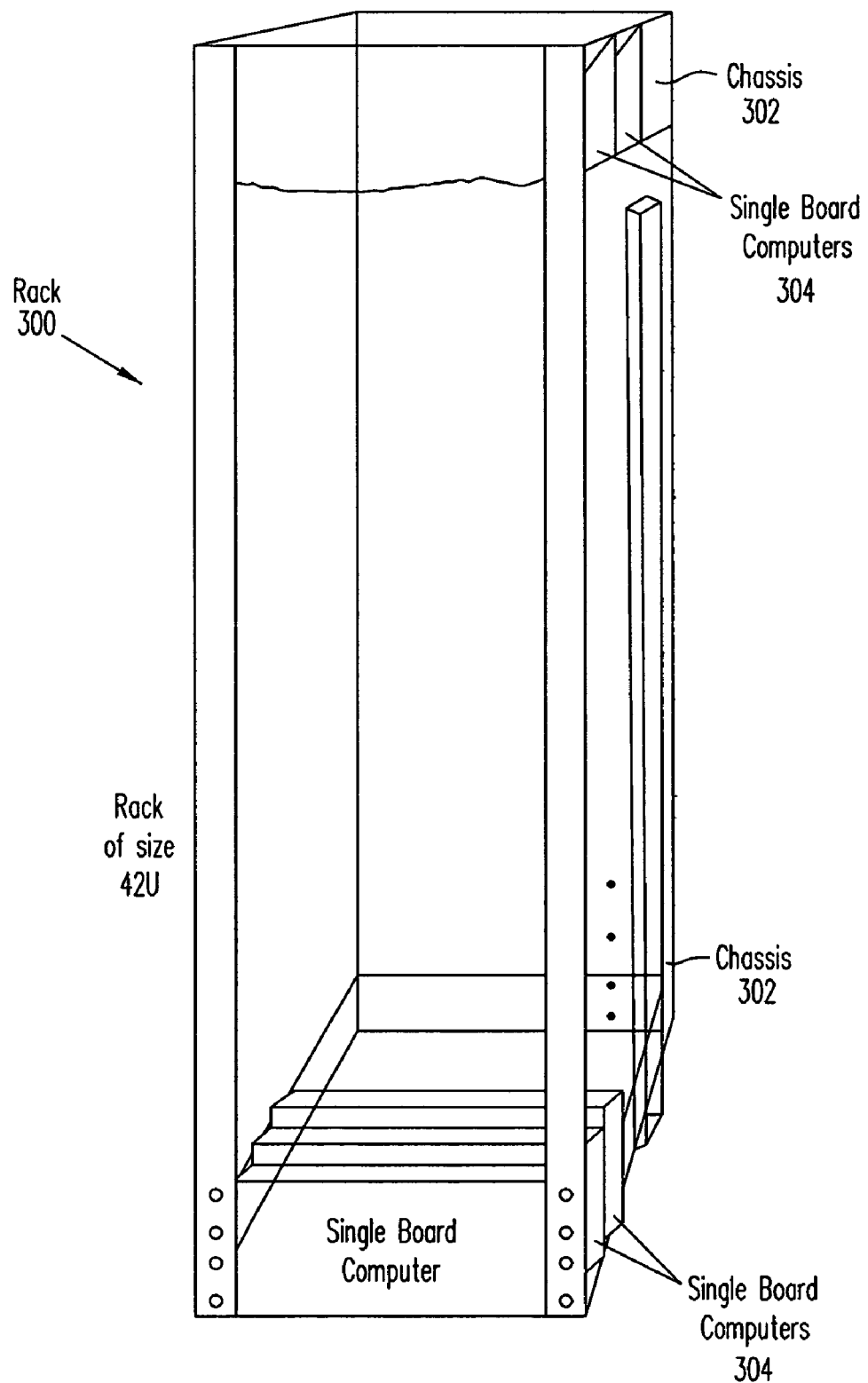
FIG. 3 illustrates a method of provisioning dynamic computing environments using computers on the rack according to one embodiment.

FIG. 3 illustrates a rack 300 including a plurality of chassis 302 mounted on rack 300 and a remote power control 306. SBCs 304 may be plugged into each chassis 302 and any number of SBCs 304 may be connected together.

Chassis 302 may be any size. For example, chassis 302 may be a 4U size and be used to plug in about twenty single board computers 304. This arrangement provides more choices to the customer with respect to the power and cost of the computers while, at the same time, reducing the space usage by a factor of about five. Alternatively, if single board computers 304 of lower power are used, then more of single board computers 304 may be plugged into a chassis of same size. By using the above arrangement as the provisioning infrastructure of a dynamic computing environment, customers' computing power requirements may be matched with their cost constraints. Furthermore, customers may now configure dynamic computing environments to optimize their performance to cost ratio at a finer granularity than may be done with a simple hosted computing environment. For example, a customer may desire the computing power for an amount that is less than the computing power offered by a computer of the size of 1U. In prior art, the customer would have been provisioned with the computing power of a 1U size computer. However, using DCEs and SBCs 304, the computing power may be further customized for the user. For example, any number of SBCs 304 providing varying amounts of computing power in increments other than the computing power of a 1U computer may be automatically provisioned to meet the customer's computing needs. Thus, the customer is thus not limited to increments of 1U computing power and a customer's computing needs may be finely tuned.

Dynamic Computing Environments enable abstractions for entities in a computing environment—servers, switches, chassis, etc. DCEs also enable customers to select and combine these entities to create and configure networks of computers. For instance, users may choose a chassis and all the computers connected to it as one network; or alternatively one or more of the chassis on a rack and all computers connected as one network; or as yet another alternative one or more racks, and all computers on the racks as one network. These choices enable different levels of security and isolation. For example, enabling different levels of security are disclosed in U.S. Pat. No. 7,027,412 entitled "System for Dynamic Provisioning of Secure, Scalable, and Extensible Networked Computing Environments," issued on Apr. 11, 2006, which is hereby incorporated by reference, as if set forth in full in this document, for all purposes. Furthermore, these choices enable different levels of performance within and across the networks as well. For instance, computers within a chassis can communicate faster with each other than when they are communicating with computers on another chassis or on another rack. Therefore, if a customer needs an environment in which most of the communication happens within the network, then a chassis as a network may be the best configuration.

Embodiments of the present invention provide improved reliability over other models of prior art such as shared hosting and virtual Operating Systems. The prior art model of shared hosting runs multiple web servers (software) on a single high-end server computer. In one embodiment of the present invention, multiple server computers of limited power with each computer running its own web server software may be used for the same cost of a single high-end server computer. For instance, in prior art, a service provider will use a single Sun Sparc computer to run three copies of Apache web server software, one each for customers A, B, and C. If the computer breaks down, all three customers lose their connectivity to their web servers. In one embodiment of the present invention, a service provider may use three different single board computers for customers A, B, and C where each computer is running its own Apache web server software. The total cost may be equal to or less than one Sun Sparc computer but using DCEs and SBCs 304 may be more reliable because the probability of failure of all of three computers failing is much less than the probability of failure of the single high end computer. Also, the prior art virtual operating system model runs multiple copies of one or more operating systems software on the same computer. Again, one embodiment of the present invention is more reliable because multiple copies of the operating systems are run on multiple SBCs 304. Also, using SBCs 304 and DCEs improve reliability because if customer A's web server (or the computer running the web server) crashes, then another computer may be provisioned automatically. This reduces server down-time.

In a further embodiment, single board computers 304 may be configured by software to work as a distributed system made of low-cost low-power computers. Dynamic computing environments constituting of such arrangements may now be used to provision distributed systems further increasing customers' choices for their computing requirements.

It will be understood that a plurality of any one of the above arrangements or combinations thereof may be used to constitute a dynamic computing environment. For example, rack mountable computers 102 and 104 and SBCs 304 may be used together on the same rack or on multiple racks. The environment enables a service provider to provide different levels of QoS guarantees to customers. Furthermore, these levels may be finely tuned to customers' needs.

Figure 4:
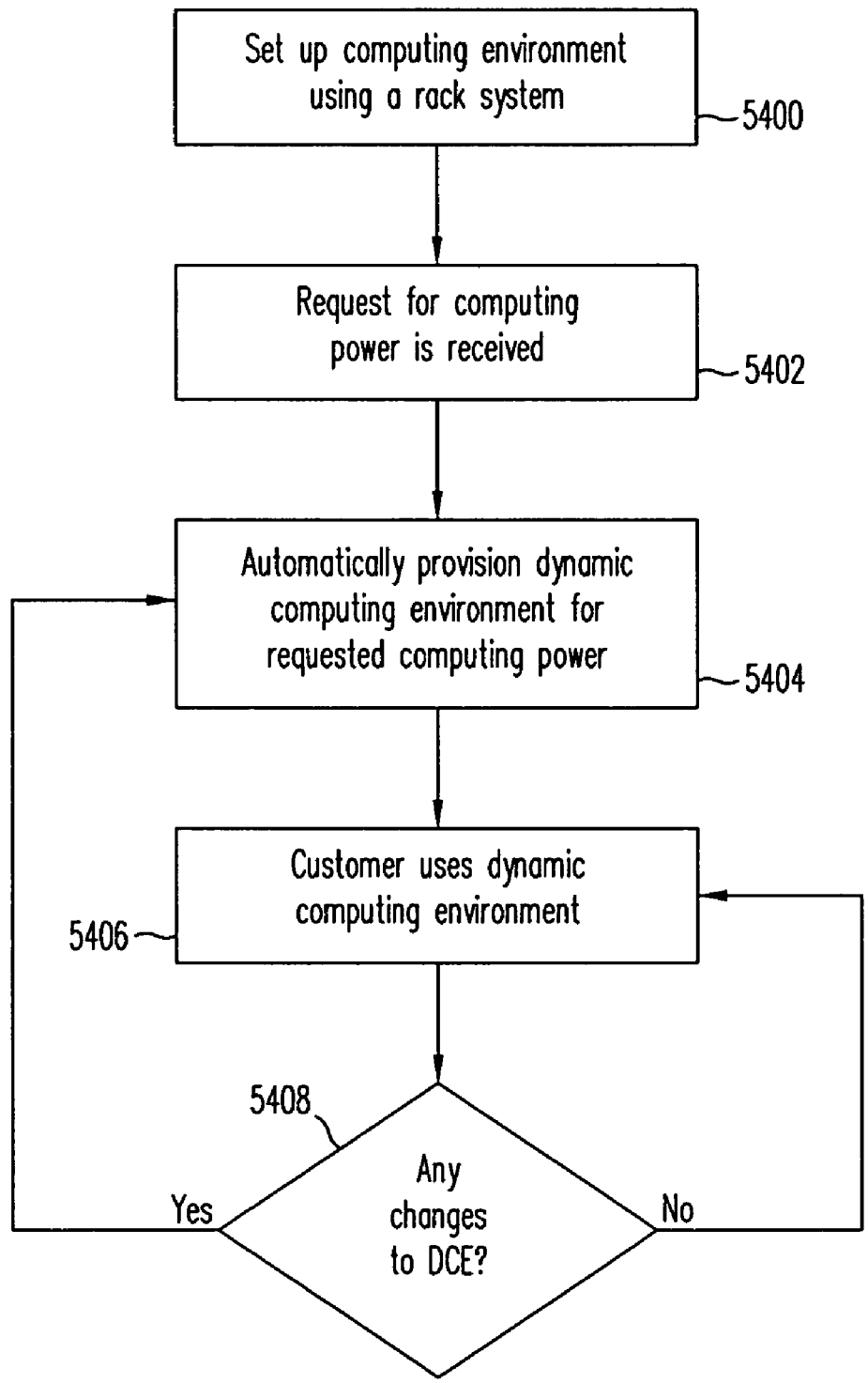
FIG. 4 illustrates a method for provisioning a dynamic computing environment using a rack according to one embodiment.

FIG. 4 illustrates a method for enabling Quality of Service tuning in a computing environment according to one embodiment. In step S400, a computing environment is set up using a rack system. For example, rack 200 and/or rack 300 described above are configured. In one embodiment, the computing environment is a dynamic computing environment that may be automatically provisioned.

In step S402, a request for computing power is received. For example, a customer requests a dynamic computing environment of a certain QoS level.

In step S404, a dynamic computing environment is automatically provisioned for the requested computing power at the QoS level. The dynamic computing environment is created using computers on rack 200, single board computers on rack 300, or a combination of both. Also, the provisioning is done without manual access to back-to-back positioned computers.

The customer then may use the dynamic computing environment (S406). Also, because the DCE enables remote administration/maintenance, if there are any changes required for the DCE (S408), the customer may automatically re-configure and provision the DCE.

Although the present invention has been discussed with respect to specific embodiments, these embodiments are merely illustrative, and not restrictive, of the invention. For example, the rack sizes that are used may differ from the ones illustrated in some of the embodiments or the chassis size used and the number of single board computers plugged in a chassis may be different from the illustration in some embodiments. Thus, the scope of the invention is to be determined by the scope of the claims.

What is claimed is:

1. A computer rack system, comprising:
   a computer rack, comprising
      a longitudinal cross section bounded by first and second surfaces perpendicular to said longitudinal cross section, and
      a latitudinal cross section bounded by top and bottom surfaces perpendicular to said latitudinal cross section which is at least a standard size of rack space;

a first computer, wherein
   said first computer comprises a front surface,
   said first computer is mountable on said computer rack such that said first surface is within said first surface of said computer rack, and
   said first computer is configured as a portion of a dynamic computing environment; and
a second computer, wherein
   second computer comprises a second front surface,
   said second computer is mountable on said computer rack such that said second front surface is within said second surface of said computer rack,
   said second computer is mountable on said computer rack such that said first and second computers of said standard size are mountable within a single standard size of rack space, and
   said second computer is configured as another portion of said dynamic computing environment.

2. The system of claim 1, wherein said standard size is a multiple of 1U.

3. The system of claim 1, further comprising a plurality of remote power switches mountable in a longitudinal direction between said first and second surfaces.

4. The system of claim 1, wherein two computers are mountable within every standard size of rack space of said computer rack system.

5. The system of claim 4, further comprising a single standard size of rack space left void.

6. The system of claim 5, wherein said single standard size of rack space left void is left void for every six standard sizes of rack space.

7. The system of claim 1, wherein
said first computer and said second computer are configured to receive a request to create a dynamic computing environment; and
said first computer and said second computer are configured to be provisioned to create said dynamic computing environment in response to said request.

8. The system of claim 1, wherein
at least a single standard size of rack space of said computer rack is left void.

9. The system of claim 8, wherein said single standard size of rack space is said standard size.

10. A system, comprising:
a computer rack, comprising
   a longitudinal cross section, and
   a latitudinal cross section bounded by top and bottom surfaces perpendicular to said latitudinal cross section which is at least a standard size of rack space;
a chassis of at least a standard size of rack space mounted on said computer rack; and
a plurality of single board computers connected to said chassis, wherein
   said single board computers are connected to said chassis such that said chassis and said single board computers are configured to be mounted within a rack space of said at least said standard size, and
   said single board computers form at least a portion of a dynamic computing environment.

11. The system of claim 10, wherein
said single board computers are configured to allow said dynamic computing environment to comprise a plurality of said single board computers, and
said plurality of said single board computers occupy less than 1U in rack space in said computer rack.

12. The system of claim 10, further comprising:
a plurality of remote power switches mountable in a longitudinal direction bounded by first and second surfaces perpendicular to said longitudinal cross section.

13. The system of claim 10, wherein
at least one of said single board computers are configured to receive a request to create a dynamic computing environment; and
a plurality of said single board computers are configured to be provisioned to create said dynamic computing environment in response to said request.

14. The system of claim 13, wherein
said single board computers are configured to allow said dynamic computing environment to comprise a number of said single board computers, and
said number of said single board computers occupy less than 1U in rack space in said computer rack.

15. The system of claim 10, further comprising
a computer configured to create said dynamic computing environment by provisioning at least one of said single board computers.

16. The system of claim 15, wherein
said computer is configured to perform said provisioning without manually accessing said computers.

17. The system of claim 15, wherein
said computer is configured to provision by virtue of being configured to provide processing power in increments other than an amount of processing power provided by a standard computer configured to be mounted in said single computer rack.

18. The system of claim 17, wherein
said computer is configured to provide said processing power by virtue of being configured to remove a one of said single board computers from said dynamic computing environment.

* * * * *